United States Patent [19]

Ito et al.

[11] Patent Number: 5,227,715
[45] Date of Patent: Jul. 13, 1993

[54] APPARATUS FOR MEASURING ELECTROMAGNETIC FIELD INTENSITY USING DUAL POLARIZED LIGHT BEAMS

[75] Inventors: Hiroshi Ito, Kasugai; Tadashi Ichikawa; Satoru Kato, both of Aichi, all of Japan

[73] Assignee: Kabushiki Kaisha Toyota Chuo Kenkyusho, Aichi, Japan

[21] Appl. No.: 787,794

[22] Filed: Nov. 4, 1991

[30] Foreign Application Priority Data

Jun. 11, 1990 [JP] Japan .................. 2-301760

[51] Int. Cl.⁵ .................. G01R 29/08; G01R 33/032; G02F 1/01; G01J 4/04
[52] U.S. Cl. .................. 324/96; 250/225; 324/244.1; 356/364; 359/254
[58] Field of Search ............... 324/72, 96, 244.1, 260; 250/225, 227.11, 231.1; 359/246, 254, 255; 356/349, 351, 364, 365, 368

[56] References Cited

U.S. PATENT DOCUMENTS

| | | | |
|---|---|---|---|
| 4,531,092 | 7/1985 | Shibano | 324/96 X |
| 4,539,521 | 9/1985 | Matsumoto | 324/244.1 |
| 4,629,323 | 12/1986 | Matsumoto | 324/96 X |

Primary Examiner—Gerard R. Strecker
Attorney, Agent, or Firm—Oblon, Spivak, McClelland, Maier & Neustadt

[57] ABSTRACT

An electromagnetic field intensity measuring apparatus capable of measuring an electromagnetic field intensity accurately and sensitively without affection by any disturbance, including a measuring light generating section for emitting a measuring light containing first and second polarized light components which are orthogonal to each other and slightly different in frequency from each other; an optical input polarization-maintaining fiber for receiving one of the first and second polarized light components in the direction of X-axis polarization and the other polarized light component in the direction of Y-axis polarization, the optical input polarization-maintaining fiber conducting the measuring light to the electromagnetic field measuring place; a sensor section disposed in the electromagnetic field measuring place, the sensor section receiving the measuring light from the optical input polarization-maintaining fiber and modulating the phase of the incident measuring light depending on the electromagnetic field intensity; and an optical output polarization-maintaining fiber for receiving one of the first and second polarized light components from the sensor section in the direction of X-axis polarization and the other polarized light component in the direction of Y-axis polarization, the optical output polarization-maintaining fiber conducting the measuring light outside the electromagnetic field measuring place. The phase difference between the first and second polarized light components contained in the measuring light from the optical output polarization-maintaining fiber is detected to determine the electromagnetic field intensity.

12 Claims, 6 Drawing Sheets

APPARATUS FOR MEASURING ELECTROMAGNETIC FIELD INTENSITY USING DUAL POLARIZED LIGHT BEAMS

BACKGROUND OF THE INVENTION

1. Field of the Invention

The present invention relates to an improved apparatus for optically measuring the intensity of an electromagnetic field.

2. Description of the Related Art

As is well known, electromagnetic waves are currently utilized in various fields of art. In the modern information-oriented society, particularly, the electromagnetic waves are increasingly important as information transmission media for broadcasting and communication. In addition, the utilization of electromagnetic waves is spreading as a source of energy which can be used in semiconductor making systems, plasma heating systems and so on.

In order to improve the aforementioned techniques, therefore, it is important to understand electromagnetic fields more accurately.

On the other hand, troubles are increasing with respect to dysfunctions of various electronic instruments created by electromagnetic waves. In the fields of office automation instruments and motorcar electronics which require the processing of information in bulk and at high-speed, these dysfunctions not only damage the electronic instruments, but also may create a social confusion or a danger to human's life. Countermeasures to electromagnetic interference (EMI) and therefore an important concern.

In order to work out a countermeasure of EMI, it is important to measure the state of the electromagnetic field accurately. This is especially true for the environmental problems associated with electromagnetic fields. For example, an intense electromagnetic field may injured human's body. An animal experiment has reported that when animals were exposed to electromagnetic waves, an increase in heart rate and body heat was found as well as necrosis of the animals' tissues. Our living environment is now subjected to electromagnetic waves having various levels of intensity and frequency which may pose a danger to human's health. Safety standards relating to the intensity of electromagnetic wave is thus desired. This also requires the accurate measurement of electromagnetic field intensity.

To this end, various types of electromagnetic field intensity measuring systems have been proposed.

One of these proposed systems comprises a probe antenna functioning as a sensor which is located in an electromagnetic field, the sensor generating electric signals which are transmitted to a detector through a conductive metallic cable of the detector being disposed outside of the electromagnetic field to be measured.

However, the use of such a metallic cable not only precludes the freedom of the probe antenna on movement and arrangement, but also disturbs the electromagnetic field to be measured, resulting in inaccurate measurements.

In order to overcome such a problem, there has also developed electromagnetic field intensity measuring systems which utilize an electro-optic crystal such as $LiNbO_3$ or the like.

Figure 4:
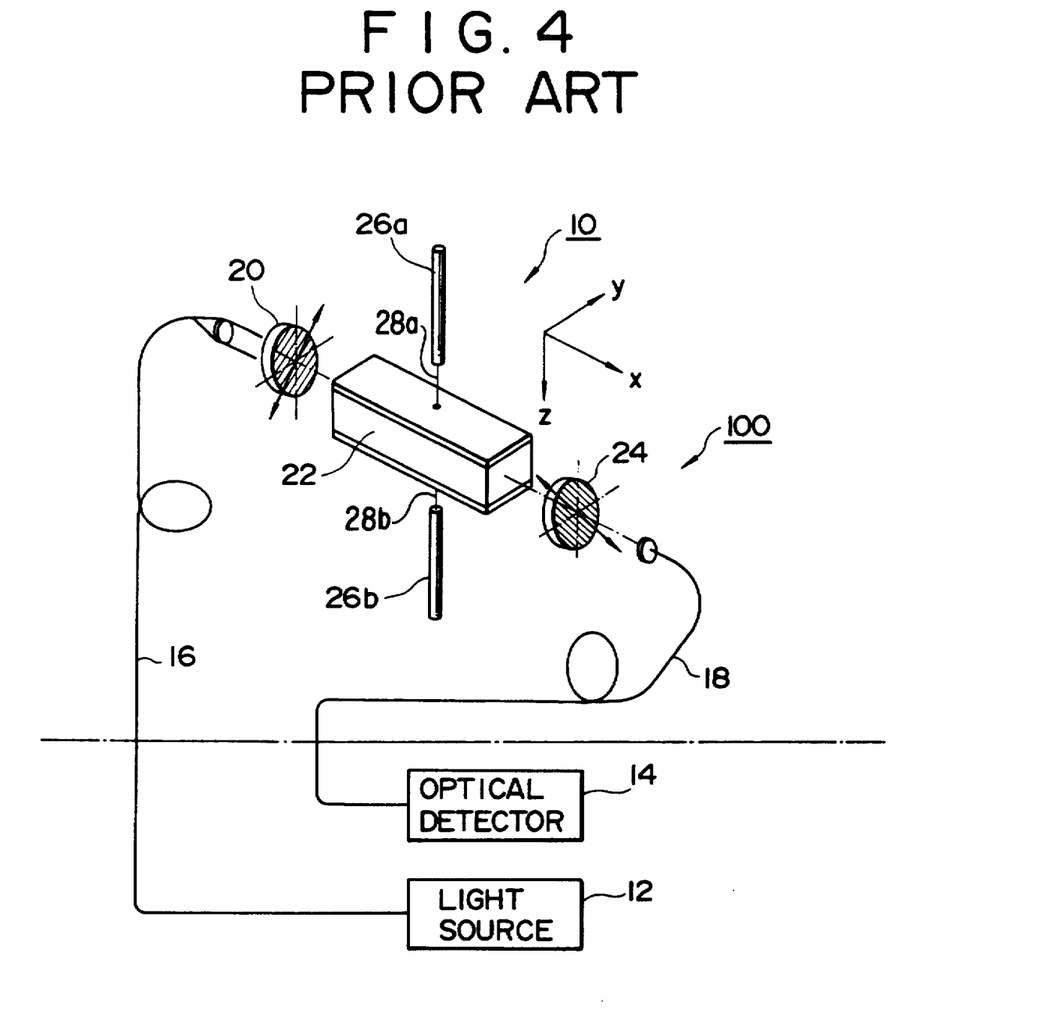
FIG. 4 is a view showing one form of electromagnetic field intensity measuring systems constructed in accordance with the prior art.

FIG. 4 shows one of such systems which comprises a sensor section 10 located in a measurement place 100, a source of light 12 disposed outside the measurement place 100 and an optical detector 14 similarly disposed outside the measurement place 100. These components are optically connected together through optical fibers 16 and 18 for inputting and outputting a measuring light, respectively.

The sensor section 10 comprises a polarizer 20, an electro-optic crystal 22, an analyzer 24, probe antennas 26a and 26b, and a pair of electrodes 28a and 28b disposed on opposite sides of the electro-optic crystal 22. The electrodes 28a and 28b are connected with the antennas 26a and 26b, respectively.

On operation, the light source 12 emits a measuring light toward the sensor section 10 through the optical fiber 16.

The electro-optic crystal 22, which is the primary part of the sensor section 10, is cut along the X-axis, Y-axis and Z-axis such that the measuring light from the light source 12 is polarized by the polarizer 20 in the X-axis direction as a linear polarized light wave which is inclined 45 degrees relative to the Y-axis. The light wave entering the electro-optic crystal 22 through the polarizer 20 will be decomposed into an ordinary ray component (Y-axis) and an extra-ordinary ray component (Z-axis), which components are independently propagated.

An electromagnetic field detected by the antennas 26a and 26b is applied between the electrodes 28a and 28b as a potential difference. Such a potential difference causes an electro-optic effect in the crystal 22, which effect varies the refractive index of the crystal 22 relative to the extra-ordinary ray. As a result, the light waves in the two components passed through the electro-optic crystal 22, that is, the ordinary and extraordinary light waves will have a phase difference therebetween. Such a phase difference is then detected by the analyzer 24 which is arranged perpendicular to the polarizer 20. If there is no phase difference between the ordinary and extra-ordinary light waves, this means that the initial linear polarized light ray is maintained and that the amplitude of the light passed through the analyzer 24 is zero. If any phase difference is created by the electromagnetic field, the light waves become elliptical-polarized light waves which will create a component passed through the analyzer 24. The amplitude of the light passed through the analyzer 24 depends on the potential difference applied thereto. When the light rays passed through the analyzer 24 are conducted to the optical detector 14 through the optical fiber 18 wherein the amount thereof is measured, one can measure the potential difference applied to the electro-optic crystal 22, that is, the intensity of the electromagnetic field.

In such a prior art system, the sensor section 10 and optical fibers 16, 18 are substantially made of dielectric material. Thus, the electromagnetic field in the measurement place 100 will not substantially be disturbed. As a result, the accurate measurement of electromagnetic field intensity can be accomplished.

On the contrary, the prior art system has a problem in that its sensitivity of measurement of electromagnetic fields is very low, resulting in difficulty in measurement of them. For example, even if a subminiature crystal 22 of 1 mm square is used, a voltage as much as 300V is required to cause the phase of rays passed through the crystal 22 to vary through 180 degrees. Depending on the gain in the antennas 26a and 26b, it is extremely difficult to measure the electromagnetic field if its intensity is weak.

In order to overcome such a problem, it has been proposed that a waveguide type Mach-Zehnder interferometric modulator be used in place of the bulk crystal.

Figure 5:
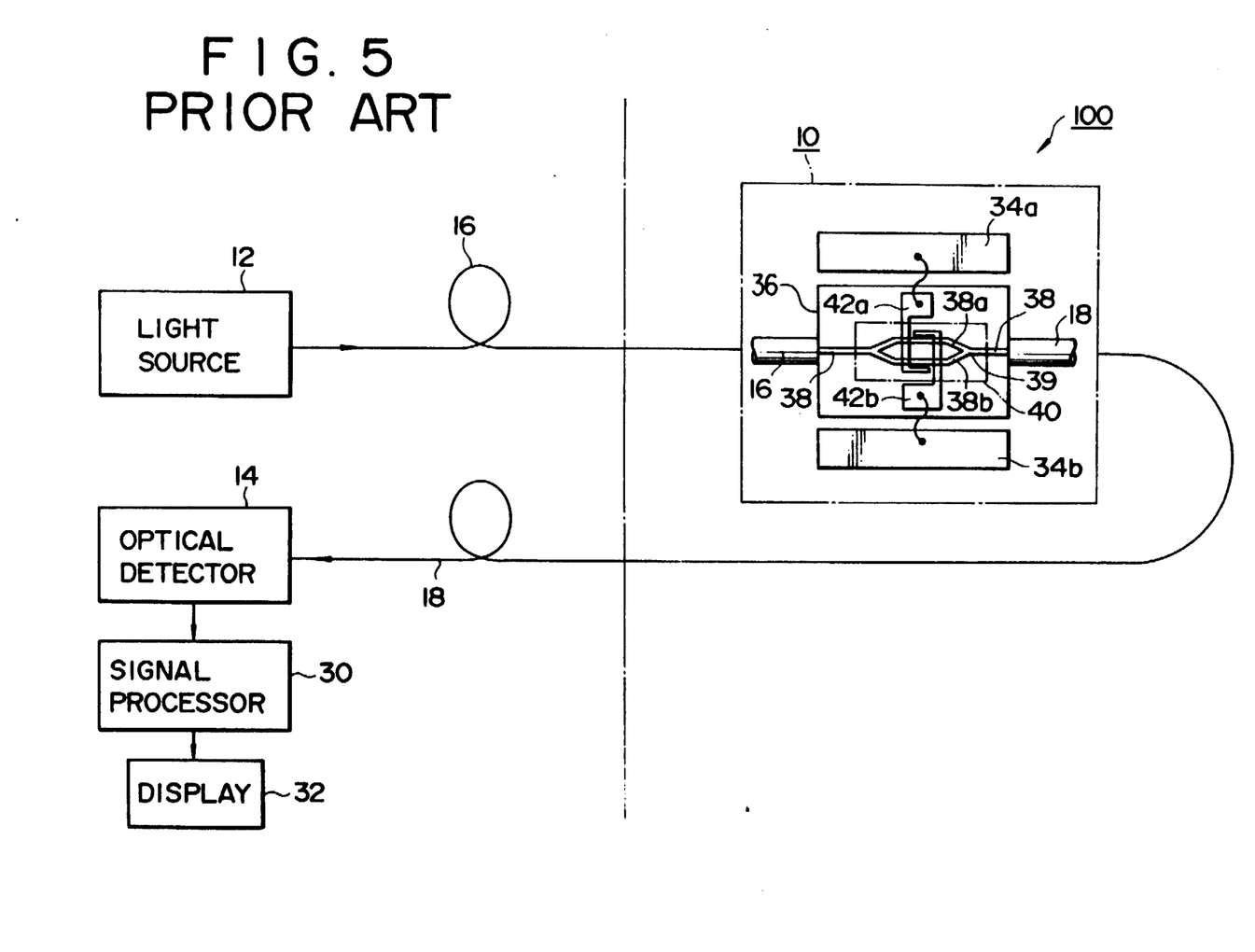
FIG. 5 is a view showing another form of the electromagnetic field intensity measuring systems according to the prior art.

FIG. 5 shows one of such systems as constructed in accordance with such a proposal. In FIG. 4, parts similar to that of FIG. 4 are designated by similar reference numerals and will not be further described.

In this system, a sensor section 10 comprises a pair of antenna metals 34a and 34b and an integrated optics 36 functioning as a waveguide type modulator. The integrated optics 36 includes an internal waveguide 38 for propagating a measuring light from an optical fiber 16. The waveguide 38 includes first and second modulating waveguide portions 38a and 38b branched and recombined in a modulating section 40. The first and second modulating waveguide portions 38a and 38b receive voltage signals through electrodes 42a and 42b, respectively. The voltage signals are field detection signals which are outputted from the antenna metals 34a and 34b and which are opposite to each other in polarity.

In such an arrangement, when the sensor section 10 receives a coherent measuring light from the light source 12 through the optical fiber 16, the measuring light will be propagated into the optical modulator section 40 through the waveguide 38 of the integrated optics 36.

Voltage signals detected by the pair of antenna metals 34a and 34b, which signals are representative of the intensity of the electromagnetic field, are applied to the first and second modulating waveguide portions 38a and 38b through the electrodes 42a and 42b. Since the applied voltages are opposite to each other in polarity, a phase difference is created in the light waves after they have passed through the waveguide portions 38a and 38b. When the light waves are re-combined in a wave combining section 39, the degree of phase difference is converted into signals indicative of the intensity of electromagnetic field. These signals are applied to an optical detector 14 through an optical fiber 18. Since several volts is at most required to vary the light amplitude from maximum to minimum, the sensitivity increases about 100 times higher than that of the system shown in FIG. 3.

When the modulated measuring light from an integrated optics 36 is detected by the optical detector 14 with respect to the amplitude thereof and the resulting signals from the optical detector 14 are inputted into a signal processing circuit 30, the latter can calculate the amplitude of the modulated measuring light, the level of the phase difference and the intensity of the electromagnetic field, the results being displayed on a display 32.

In such a manner, the prior art system of FIG. 5 can measure the weak intensity of an electromagnetic field because of its increased sensitivity In this prior art system, however, the intensity of the modulated measuring light inputted to the optical detector 14 varies greatly due to variations in the intensity of the light emitted from the light source 12 or due to various disturbances such as variations of temperature, pressure, vibration and others which are applied to the optical fibers 16 and 38. If these problems exist, the measurement cannot be accurately performed by the prior art system. Such variations of the light intensity due to the disturbances are particularly increased in the low-frequency range. This greatly decreases the sensitivity of measurement at the low-frequency range.

SUMMARY OF THE INVENTION

It is therefore an object of the present invention to provide an electromagnetic field intensity measuring apparatus which can measure the intensity of an electromagnetic field more accurately and sensitively without affection from by any disturbance.

To this end, the present invention provides an electromagnetic field intensity measuring apparatus comprising:

measuring light generating means for outputting a measuring light including first and second polarized light components which are orthogonal to each other and have frequencies slightly different from each other;

sensor means located in said electromagnetic field measuring place for modulating the phase of the measuring light from said measuring light generating means, depending on the intensity of the electromagnetic field; and electromagnetic field intensity measuring means for determining the intensity of the electromagnetic field in the electromagnetic field measuring place, based on the measuring light outputted from said sensor means, said sensor means including:

an antenna section for detecting the electromagnetic field and for outputting a voltage representative of the intensity of the detected electromagnetic field; and an integrated optics for forming a phase difference corresponding to the electromagnetic field intensity between the first and second polarized light components in said incident measuring light, based on the voltage signal from said antenna section, said electromagnetic field intensity measuring means being adapted to determine the electromagnetic field intensity from the phase difference from said sensor means.

In another aspect of the present invention, the electromagnetic field intensity measuring apparatus also comprises:

input light-transmission means for conducting the measuring light from said measuring light generating means to said sensor means; and output light-transmission means for conducting the measuring light from said sensor means to said electromagnetic field intensity measuring means, said electromagnetic field intensity measuring means including:

a beat signal detecting section for receiving the measuring light outputted through said output light-transmission means, said beat signal detecting section being adapted to square-law detect the first and second polarized light components contained in said measuring light and to output a beat signal representative of a frequency difference between said two polarized light components and a calculating section for determining the intensity of the electromagnetic field from the detected phase difference between said first and second polarized components, based on said beat signal.

In still another aspect of the present invention, said measuring light generating means and electromagnetic field intensity measuring means are placed outside of the electromagnetic field intensity measuring place; said input light-transmission means is in the form of an optical input polarization-maintaining fiber for receiving one of said first and second polarized light components in the measuring light from said sensor means in the direction of X-axis polarization and for receiving the other polarized light component in the direction of Y-axis polarization, said optical input polarization-maintaining fiber being adapted to conduct the measuring light to said sensor means placed in the electromagnetic field intensity measuring place; and said output light-transmission means is in the form of an optical output polarization-maintaining fiber for receiving one of said first and second polarized light components in the measuring light from said sensor means in the direction of X-axis polarization and for receiving the other polarized light component in the direction of Y-axis polarization, said optical input polarization-maintaining fiber being adapted to conduct the measuring light to said electromagnetic field intensity measuring means placed outside of the electromagnetic field intensity measuring place.

In a further aspect of the present invention, said integrated optics comprises a waveguide for propagating one of the polarized light components from said optical input polarization-maintaining fiber in TE mode and for propagating the other polarized light component from said optical input polarized light component in TM mode; and a phase modulating section for applying the voltage signal from said antenna section to said waveguide to cause it to form a phase difference between the TM and TE mode polarized light components, which corresponds to the intensity of the electromagnetic field.

In such an arrangement, said measuring light generating means may be a stabilized transverse Zeeman type double-frequency HeNe laser or a combination of a single-frequency laser with an optical frequency shifting element which can frequency shift the light waves of the single-frequency laser.

If the single-frequency laser of said type is used, it is preferred that the measuring light generating means comprises a light source for emitting a coherent measuring light; a first polarizing beam splitter for separating the measuring light into first and second polarized light components which are orthogonal to each other; an optical frequency shifting element for shifting the frequency of the second polarized light component by a given frequency such that the second polarized light component will have a frequency slightly different from that of said first polarized light component; and a second polarizing beam splitter for recombining the first polarized light component with the second, polarized light component outputted through the optical frequency shifting element to form a measuring light including the first and second polarized light components which are orthogonal to each other and slightly different in frequency from each other.

It is also preferred that the light source is generally a semiconductor laser connected to the optical fiber.

It is further preferred that the material for the integrated optics may be selected from a group consisting of ferroelectric materials such as $LiNbO_3$, $LiTaO_3$, semiconductors such as GaAlAs, Si and amorphous materials such as $SiO_2$, $Si_3N_4$. The use of $LiNbO_3$ is particularly preferred since it has a more superior electro-optic effect.

The antenna section may be of any suitable type. For detection of an electromagnetic high-frequency field, the antenna section may be a minute dipole antenna system. For detection of an electromagnetic low-frequency field, a simple metal plate may be used. If such a metal plate is used, it may be formed in the form of an integrated antenna unit on the same substrate as the integrated optics by any suitable means such as photolithograph. This provides an advantage in that the entire sensor can be reduced in size.

On measurement, the sensor means is first placed in the electromagnetic field measuring place while the measuring light generating means and the electromagnetic field intensity measuring means are located outside of the measuring place.

The measuring light generating means emits a measuring light containing first and second polarized light components which are orthogonal to each other and slightly different in frequency from each other. One of the first and second polarized light components is propagated to the sensor means through the optical polarization-maintaining fiber in the direction of X-axis polarization. The other polarized light component is propagated to the sensor means through the optical polarization-maintaining fiber in the direction of Y-axis polarization.

As described, the sensor means comprises the antenna section and the integrated optics. The integrated optics includes the waveguide for conducting the measuring light inputted thereinto through the optical polarization-maintaining fiber and the phase modulating section for applying a voltage signal from the antenna section to the waveguide.

When the measuring light enters the waveguide, one of the first and second polarized light components thereof is propagated through the waveguide to the phase modulating section in TE mode. The other polarized light component is propagated through the waveguide to the phase modulating section in TM mode.

Since the voltage signal is applied from the antenna section to the waveguide, the phase modulating section causes a phase difference to be produced between the polarized light components of TM and TE modes, depending on the intensity of the electromagnetic field.

Thus, the electromagnetic field intensity can be measured by measuring the phase difference between the first and second polarized light components from the phase modulating section.

When passed through the phase modulating section, the measuring light is fed to the beat signal detecting section of the electromagnetic field intensity measuring means placed outside of the measuring place through the optical output polarization-maintaining fibers. At this time, one of the first and second polarized light components is propagated through the optical fiber as in the direction of X-axis polarization while the other polarized light component is propagated through the same fiber as in the direction of Y-axis polarization.

When the beat signal detecting section receives the measuring light through the optical polarization-maintaining fiber, it square-law detects the first and second polarized light components contained in the measuring light, the frequency difference between these polarized light components being then outputted from the beat signal detecting section as a beat signal.

The calculating section detects the phase difference between the first and second polarized light components on the basis of the beat signal and calculates the intensity of the electromagnetic field on the basis of the detected phase difference.

In such a manner, the present invention measures the electromagnetic field intensity as a beat signal from the first and second polarized light components slightly different in frequency from each other, rather than as the intensity of the measuring light. Consequently, the electromagnetic field intensity can be measured more accurately without affection from any disturbance or variation.

More particularly, the present invention detects a beat signal representative of the phase difference between the first and second polarized light components in the measuring light. Such a beat signal will not be greatly affected by disturbances. When the beat signal is used to detect the phase difference between the first and second polarized light components as in the present invention, the electromagnetic field intensity in the measuring place can be optically measured over a wide range in a stable and accurate manner substantially without affection of various disturbances such as variations in the intensity of the light source, the optical fiber, the measuring light and others.

The present invention is particularly effective to measure the electromagnetic field intensity in a low-frequency region approximate to DC which could not be measured in the prior art.

In the electromagnetic field intensity measuring apparatus of the present invention, the optical input and output polarization-maintaining fibers are preferably formed so that the first polarized light component contained in the incident measuring light will pass through the optical input and output polarization-maintaining fibers in different polarization directions and also the second polarized light component will pass through the optical input and output polarization-maintaining fibers in different polarization directions.

Thus, the directions of polarization along which the first and second polarized light components in the measuring light are propagated through the optical input and output polarization-maintaining fibers are respectively changed from one to another. Therefore, the first and second polarized light components will be equally subjected to the completely same variations of phase due to affection of various disturbances applied to the respective optical fibers (temperature, vibration, pressure and so on).

Even if the first and second polarized light components are varied in phase due to any disturbance as they are propagated through the optical polarization-maintaining fibers, the beat signal from the first and second polarized light components will not be changed with respect to phase at all. Consequently, the present invention can more accurately measure the electromagnetic field intensity without affection of any disturbance applied to the optical fibers.

DETAILED DESCRIPTION OF THE PREFERRED EMBODIMENTS

Figures 1, 1B:
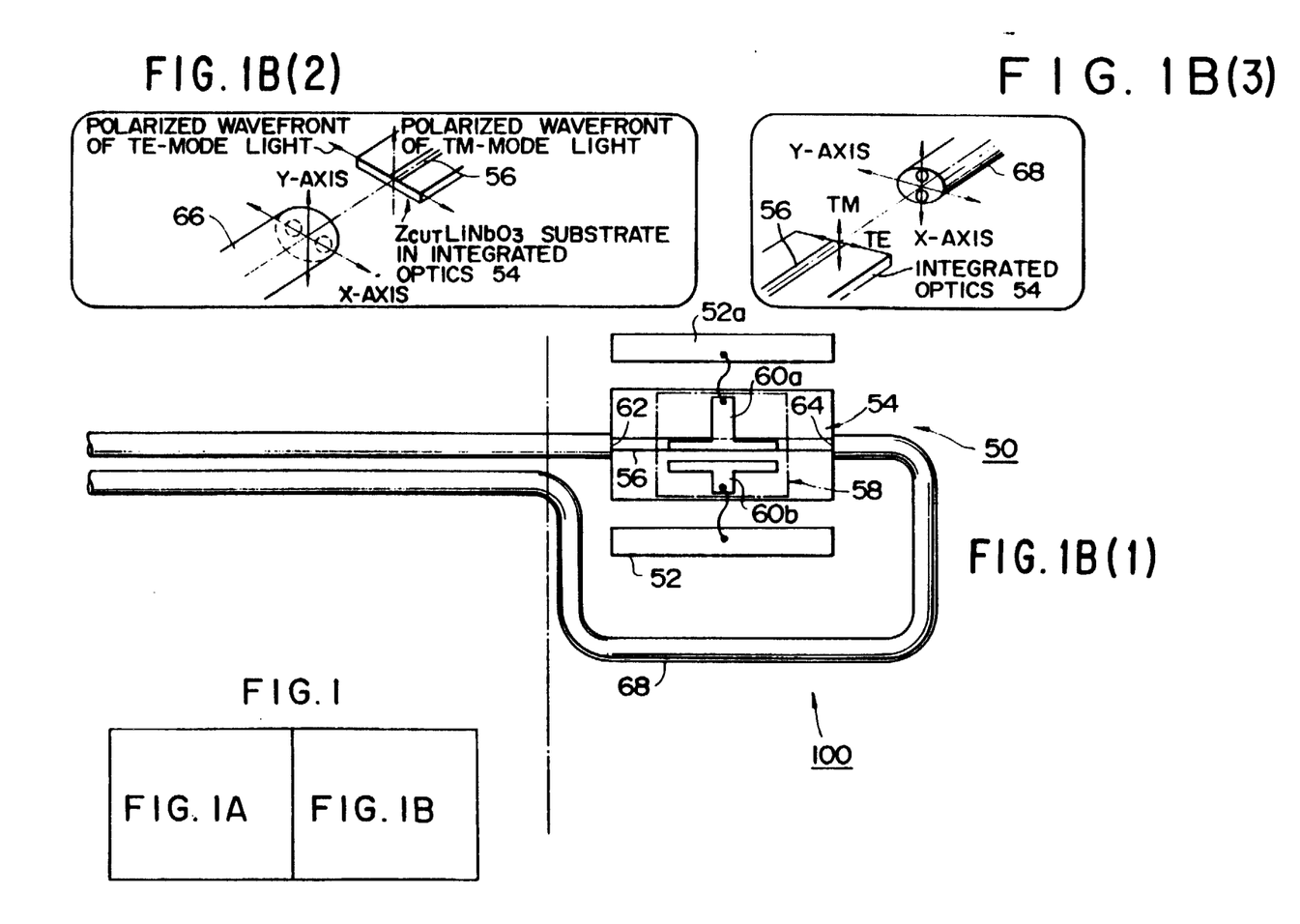
FIG. 1 is a block diagram of a preferred embodiment of an electromagnetic field intensity measuring apparatus constructed in accordance with the present invention.
FIG. 1(B) schematically shows (C) the optical coupling between the optical input polarization-maintaining fiber and the integrated optics waveguide and schematically shows (D) the optical coupling between the integrated optics waveguide and the optical output polarization-maintaining fiber.
Figure 1A:
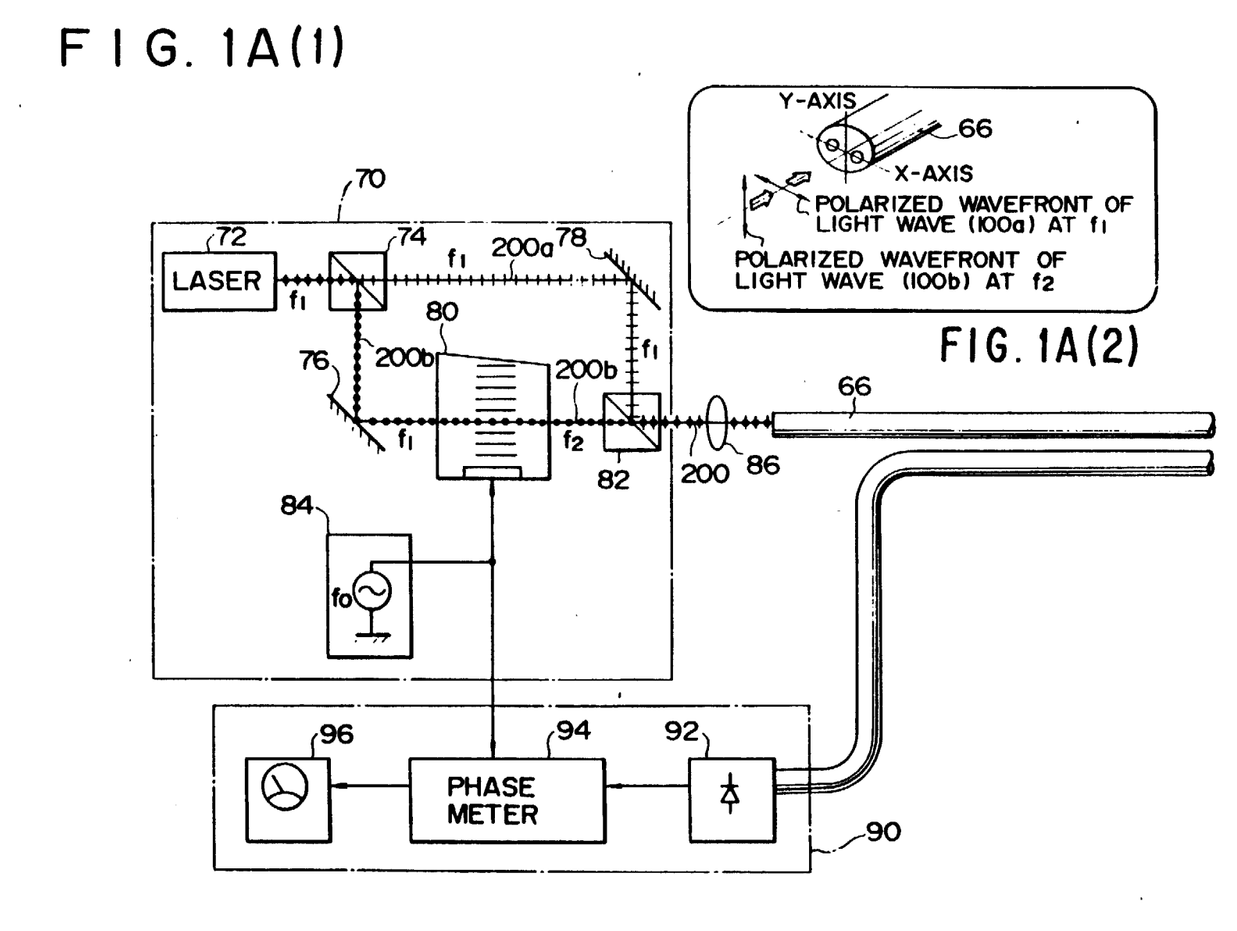
FIG. 1A shows (A) light generating and measuring sections and schematically shows (B) the polarization wavefronts applied to the optical input polarization-maintaining fiber.

Referring to FIGS. 1A and 1B there is shown a preferred embodiment of an electromagnetic field intensity measuring apparatus constructed in accordance with the present invention, which comprises a sensor section 50 placed in an electromagnetic field measuring place 100, a measuring light generating section 70 placed outside of the measuring place 100 and an electromagnetic field intensity measuring circuit 90 similarly located outside of the measuring place 100.

The measuring light generating section 70 is optically connected to the sensor section 50 through an optical input polarization-maintaining fiber 66. The sensor section 50 is optically connected to the electromagnetic field intensity measuring circuit 90 through an optical output polarization-maintaining fiber 68.

The measuring light generating section 70 is in the form of a source of coherent light which emits a measuring light 200 containing first and second polarized light components 200a and 200b, these polarized light components being orthogonal to each other and slightly different in frequency from each other. The measuring light generating section 70 may be one of a stabilized transverse Zeeman type double-frequency HeNe laser and a single-frequency laser adapted to perform the frequency shift of light waves by the use of an optical frequency shifting element. In this embodiment, the measuring light generating section 70 is of the latter type. More particularly, the measuring light generating section 70 comprises a source of laser light 72, a first polarizing beam splitter 74, reflecting mirrors 76 and 78, an optical frequency shifting element 80, a second polarizing beam splitter 82 and an oscillator 84.

The light source 72 may be in the form of a semiconductor laser in matching connection with the optical fiber 66. The semiconductor laser emits a laser beam having an optical frequency $f_1$. In this embodiment, the laser beam is collimated into parallel rays and has its direction of polarization inclined 45 degrees relative to the plane of sheet in FIG. 1A.

The measuring light emitted from the laser 72 is divided into a first polarized light component 200a parallel to the plane of the sheet and a second polarized light component 200b perpendicular to the plane of the sheet, through the first polarizing beam splitter 74. The second polarized light component 200b is reflected by the mirror 76 toward the optical frequency shifting element 80 which is driven by the oscillator 84. If it is assumed that the oscillator 84 has its oscillating frequency $f_0$, the second polarized light component 200b passed through the optical frequency shifting element 80 will have its frequency $f_2$ obtained by shifting the original frequency $f_1$ by a frequency $f_0$: $f_2 = f_1 + f_0$. The second polarized light component 200b then enters the second polarizing beam splitter 82 from the optical frequency shifting element 80.

On the other hand, the first polarized light component 200a separated by the first polarizing beam splitter 74 is reflected by the reflecting mirror 78 toward the second polarizing beam splitter 82.

The first and second polarized light components 200a and 200b are received by the second polarizing beam splitter 82 which recombines them to form a measuring light 200 which in turn enters the polarization-maintaining fiber 66 through a lens 86.

Thus, the measuring light 200 emitted from the measuring light generating section 70 will contain the first polarized light component 200a having its optical frequency $f_1$ and the second polarized light component 200b having its optical frequency $f_2$, the optical frequency of the first polarized light component 200a being slightly different from that of the second polarized light component. These polarized light components are orthogonal to each other.

The optical polarization-maintaining fiber 66 having X- and Y-axes are representative of different directions of polarization, respectively. As shown in FIG. 1A(B) the optical fiber 66 is adapted to receive the first polarized light component 200a of frequency $f_1$ in one of the polarization directions (e.g. Y-axis) and the second polarized light component 200b of frequency $f_2$ in the other direction of polarization (e.g. X-axis).

After propagating through the optical polarization-maintaining fiber 66, the measuring light 200 enters the sensor section 50.

The sensor section 50 comprises an integrated optics 54 including a phase modulating section 58 for causing the phase of the measuring light to change by applying an external voltage, and a pair of antennas 52a and 52b for detecting an electromagnetic field to be measured. When the sensor section 50 receives the measuring light from the optical polarization-maintaining fiber 66, the sensor section 50 modulates the phase of the measuring light 200, depending on the intensity of an electromagnetic field in the measuring place 100. The modulated measuring light is then directed to the optical polarization-maintaining fiber 68.

The integrated optics 54 includes a waveguide 56 for the measuring light, in addition to the phase modulating section 58. The waveguide 56 is adapted to propagate the first polarized light component 200a in the incident measuring light 200 in TE mode and the second polarized light component 200b in TM mode.

Figure 3A:
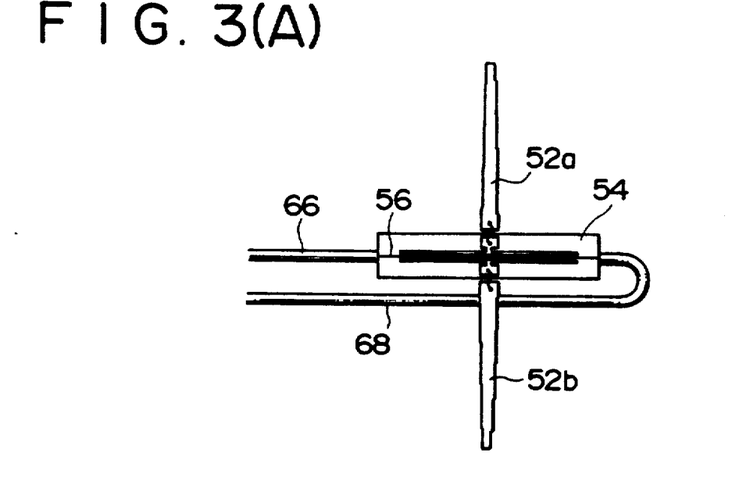
FIGS. 3(A), (B) and (C) shows examples of the antenna section which utilize a minute dipole antenna, plate-like low-frequency antenna and minute integrated dipole antenna, respectively.
Figure 3B:
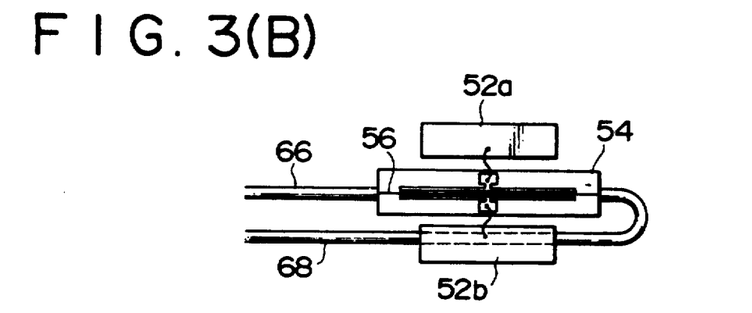
Figure 3C:
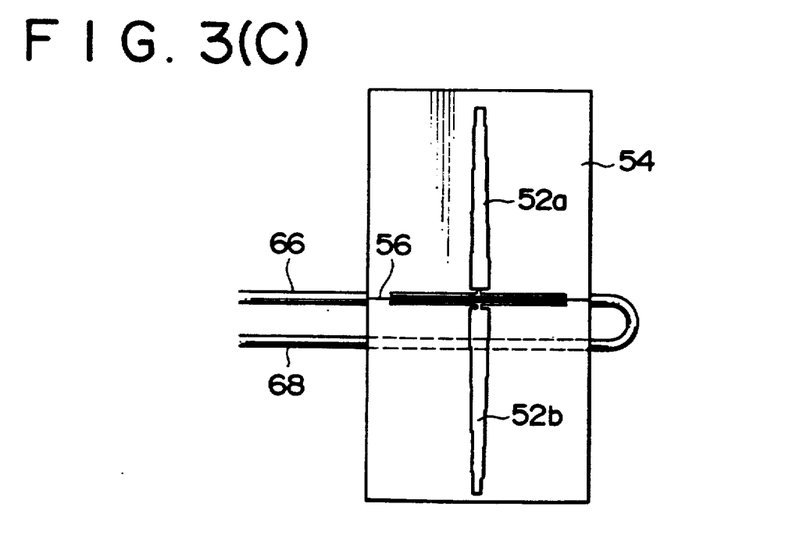

The paired antennas 52a and 52b are adapted to detect an electromagnetic field in the measuring place 100 and to convert it into a voltage signal corresponding to the intensity of the electromagnetic field detected. Such antennas 52a and 52b may be of any suitable type, for example, a minute dipole antenna for high-frequency detection as shown in FIG. 3(A) or a simple metallic plate having an appropriate size for low-frequency detection as shown in FIG. 3(B). Furthermore, the antennas may be formed into a minute integrated dipole antenna on the same substrate as in the integrated optics 54 by the use of any suitable means such as photolithograph, as shown in FIG. 3(C). In this embodiment, each of the antennas 52a and 52b is in the form of a simple metal plate, as shown in FIG. 1.

The phase modulating section 58 includes electrodes 60a and 60b for applying voltage signals from the antennas 52a and 52b to the waveguide 56. There will be thus generated a phase difference $\phi$ between the first polarized light component 200a propagated in TE mode and the second polarized light component 200b propagated in TM mode, this phase difference corresponding to the magnitude of the voltage applied to the waveguide.

The integrated optics 54 may be made of any material selected from a group consisting of ferroelectric materials such as $LiNbO_3$ and $LiTaO_3$, semiconductor materials such as GaAlAs and Si, and amorphous materials such as $SiO_2$ and $Si_3N_4$. This embodiment uses an integrated optics 54 made of $LiNbO_3$ and particularly Z cut $LiNbO_3$ since it has an increased electro-optic effect.

The waveguide 56 is made of a material having a refractive index higher than those of the surrounding materials such that light waves will be confined,. and propagated therein.

As shown in FIG. 1B(C) the integrated optics 54 is formed such that the crystalline axes of its substrate (Z plate $LiNbO_3$) are aligned with the polarization axes in the optical polarization-maintaining fiber 66. As a result, the first polarized light component 200a propagated through the optical fiber 66 along the direction of X-axis polarization will be propagated through the waveguide 56 in TE mode while the second polarized light component 200b propagated through the optical fiber 66 in the direction of Y-axis polarization will be propagated through the waveguide 56 in TM mode.

Figure 2:
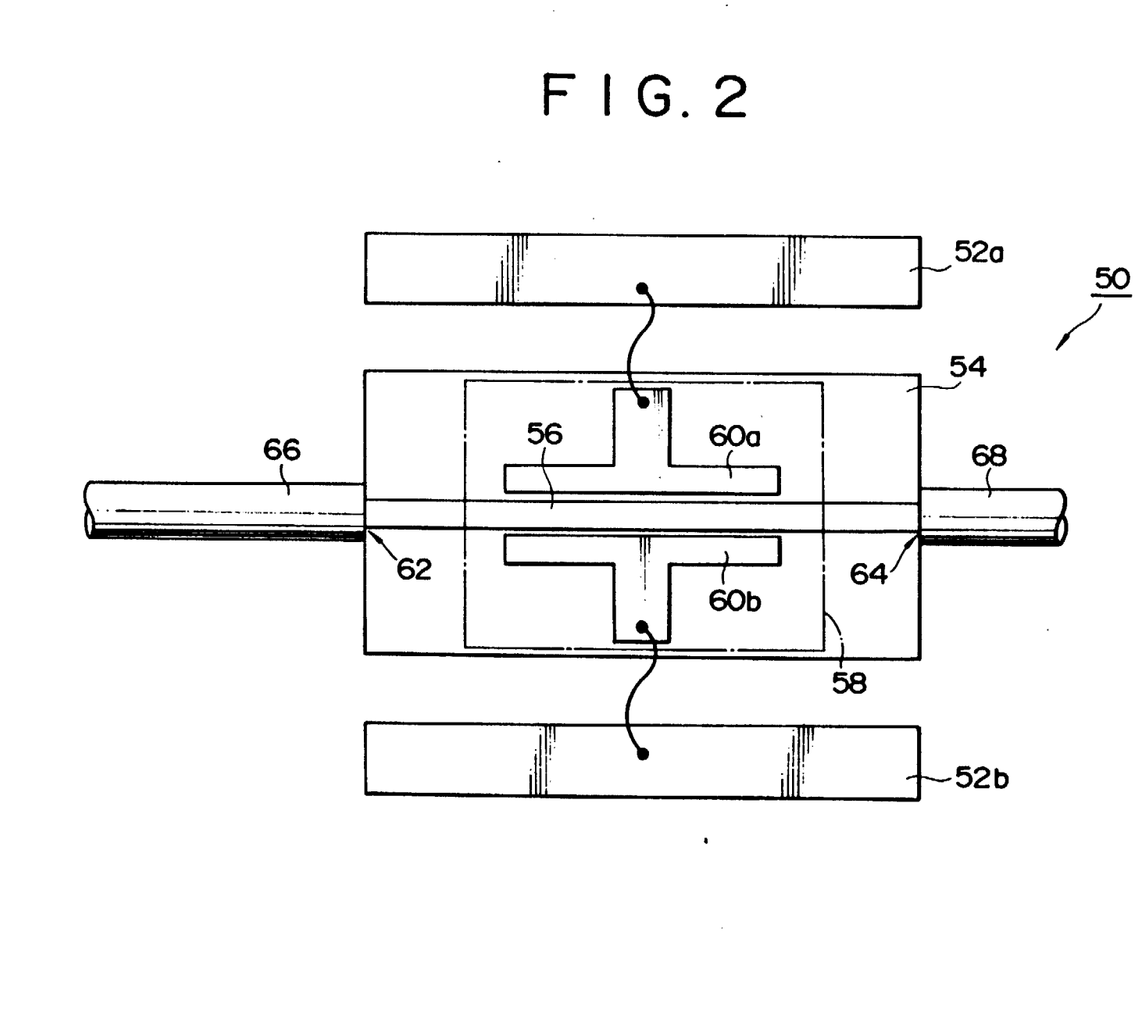
FIG. 2 shows another arrangement of the integrated optics in the sensor section shown in FIG. 1.

The substrate of the integrated optics 54 may be made of X cut $LiNbO_3$ in place of the aforementioned Z cut $LiNbO_3$ In such a case, the electrodes 60a and 60b in the phase modulating section 48 may be formed into such a configuration as shown in FIG. 2.

In the sensor section 50 thus formed, the first and second polarized light components 200a and 200b having their optical frequencies $f_1$ and $f_2$, which are contained in the measuring light 200 emitted from the measuring light generating section 70, enter the waveguide 56 through the optical polarization-maintaining fiber 66. The first polarized light component 100a is propagated through the waveguide 56 in TE mode while the second polarized light component 200b is transmitted through the waveguide 56 in TM mode.

At this time, a voltage corresponding to the electromagnetic field intensity detected by the antennas 52a and 52b has been applied to the phase modulating section 58. Thus, the waveguide 56 of the phase modulating section 58 is changed in refractive index by the electro-optic effect induced by the applied voltage. This change in refractive index changes the phases of the first and second polarized light components 200a and 200b being propagated through the waveguide 56. The electro-optic effect from the Z cut $LiNbO_3$ has a greater effect on the light waves placed in TM mode than the light waves placed in TE mode. As a result, only the second polarized light component 200b propagated through the waveguide 56 in TM mode will be modulated in phase, with the modulation index being $\phi$.

After being subjected to the phase modulation, the first and second polarized light components 200a and 200b enter the optical polarization-maintaining fiber 68 through the output end of the waveguide 56.

This optical polarization-maintaining fiber 68 includes two X- and Y-axes representative of the directions of polarization. Unlike the optical input polarization-maintaining fiber 66, the optical output polarization-maintaining fiber 68 is adapted to propagate the first TE-mode polarized light component 200a along the direction of Y-axis polarization and to propagate the second TM-mode polarized light component 200b in the direction of X-axis polarization. These polarized light components 200a and 200b are transmitted through the optical fiber 68 toward the electromagnetic field intensity measuring circuit 90. The optical output polarization-maintaining fiber 68 is disposed close and parallel to the optical input polarization-maintaining fiber 66. Thus, these optical fibers 66 and 68 will be subjected to substantially the same affection of disturbances (temperature, vibration, etc.).

Based on the incident measuring light 200, the electromagnetic field intensity measuring circuit 90 is adapted to determine the electromagnetic field intensity in the measuring place 100. More particularly, the circuit 90 comprises an optical detector element 92, a phase meter 94 and a display 96.

The optical detector element 92 functions as a beat signal detecting section which converts the first and second polarized light components 200a and 200b having their frequencies $f_1$ and $f_2$ slightly different from each other into electrical signals. The beat signal detecting section 92 is adapted to square-law detect these light components 200a and 200b to form a beat output signal representative of the frequency difference therebetween. The beat signal contains the modulation index $\phi$ which has been produced when the measuring light passes through the phase modulating section 58.

The phase meter 94 performs the phase sensitive detection of the beat signal from the optical detector 92 by using the oscillating output of the oscillator 84 as a reference signal. As a result, the modulation index $\phi$ is detected and directed to the display 96.

The modulation index $\phi$ is in a given relationship relative to the electromagnetic field intensity in the measuring place 100.

Thus, the display 96 is adapted to indicate the value of the electromagnetic field intensity, based on the inputted modulation index $\phi$.

On operation, the measurement of the electromagnetic field intensity in the measuring place 100 is initiated by placing the sensor section 50 in the measuring place 100 before the laser 72 emits a laser beam having an optical frequency $f_1$.

The laser beam is collimated into parallel rays, with the direction of polarization being inclined 45 degrees relative to the plane of sheet in FIG. 1. As the laser beam passes through the first polarizing beam splitter 74, it is divided into the first polarized light component 200a parallel to the plane of sheet and the second polarized light component 200b perpendicular to the plane of sheet. The second polarized light component 200b then passes through the optical frequency shifting element 80 wherein this light component 200b is frequency shifted to have a frequency $f_2(=f_1+f_0)$, that is, one obtained by shifting the original frequency $f_1$ by a frequency $f_0$.

The first and second polarized light components 200a and 200b are then re-combined by the second polarizing beam splitter 82 to form a measuring light 200 in the form of a single light beam.

After passing through the lens 86, the measuring light 200 enters the optical input polarization-maintaining fiber 66. As shown in FIG. 1(A), the first polarized light component 200a of the frequency $f_1$ is propagated through the optical fiber 66 in the first direction of X-axis polarization while the second polarized light component 200b of the frequency $f_2$ is propagated through the optical fiber 66 in the second direction of Y-axis polarization. After the first and second polarized light components 200a and 200b have been independently propagated through the optical input polarization-maintaining fiber 66, they enter the waveguide 56 through the input end 62 of the integrated optics 54.

As shown in FIGS. 1A and 1B, the first polarized light component 200a is propagated through the waveguide 56 of the phase modulating section 58 in TE mode while the second polarized light component 200b is propagated through the waveguide 56 in TM mode.

At this time, voltage signals corresponding to the electromagnetic field intensity have been applied from the antennas 52a and 52b to the respective electrodes 60a and 60b in the phase modulating section 58. The electro-optic effect induced by these voltages varies the refractive index in the waveguide 56 of the phase modulating section 58. Thus, the light waves being propagated through the waveguide 56 will be changed in phase.

Since the integrated optics 54 of this embodiment is designed to have its substrate of Z cut LiNbO$_3$, the electro-optic effect will have a greater effect on the light waves propagated in TM mode than those propagated in TE mode. As a result, the first polarized light component 200a propagated through the phase modulating section 58 in TE mode will not substantially be subjected to the phase modulation while only the second polarized light component 200b propagated through the phase modulating section 58 will be subjected to the phase modulation, with the modulation index $\phi$ being created.

If the modulation index $\phi$ is measured, therefore, the electromagnetic field intensity can be determined.

After passing through the phase modulating section 58, the first and second polarized light components 200a and 200b enter the optical output polarization-maintaining fiber 68 through the output end 64 of the waveguide 56. Unlike the case of the optical input polarization-maintaining fiber 66, the second TM-mode polarized light component 200b is propagated through the optical output polarization-maintaining fiber 68 in the direction of X-axis polarization while the first TE-mode polarized light component 200a is propagated through the optical fiber 68 in the direction of Y-axis polarization. It is to be noted that when the first and second polarized light components 200a and 200b pass through the optical output polarization-maintaining fiber 68, they are propagated through this optical fiber 68 in the directions of polarization which are exactly opposite to the directions of polarization in the optical input polarization-maintaining fiber 66. Even if the first and second polarized light components 200a and 200b have the respective phase changes $\theta_1$ and $\theta_2$ due to various disturbances (temperature, vibration, pressure, etc.), these phase changes will be substantially equalized through the entire light waves, that is, $\theta_1 = \eta_2$.

After the first and second polarized light components 200a and 200b have been inputted into the optical detector element 92, they are converted into electrical signals which are in turn subjected to square-law detection to form a beat signal representative of the frequency difference ($f_1 - f_2$) between the first and second polarized light components.

More particularly, the value $E_2$ of the second polarized light component 200b of the frequency $f_2$ passed through the phase modulating section 58 in TM mode is given by:

$$E_2 + E_{02} \cdot \cos(2\pi \cdot f_2 \cdot t + \theta_2 + \phi)$$

where $E_{02}$ is constant and t is time.

The first polarized light component 200a of the frequency $f_1$ passed through the phase modulating section 58 in TE mode will not substantially be subjected to phase modulation, its value $E_1$ being given by:

$$E_1 = E_{01} * \cos(2 * \pi * f_1 * t + \theta_1)$$

where $E_{01}$ is constant.

In these equations, $\theta_1$ and $\theta_2$ represent phase shifts of the first and second polarized light components induced by any disturbance as they are passing through the optical fibers 66 and 68, respectively.

If these two signals $E_1$ and $E_2$ are subjected to the square-law detection to form a beat signal, the value I of such a beat signal is given by:

$$I = I_0 * \cos[2 * \pi * (f_1 - f_2) * t + (\theta_1 - \theta_2) + \phi]$$

where $(f_1 - f_2) = f_0$.

Since the first and second polarized light components 200a and 200b being propagated through the respective optical fibers 66 and 68 are subjected to substantially the same affection from any disturbance as described, $\theta_1 = \theta_2$. Thus, the beat signal I can be re-written as follows:

$$I = I_0 * \cos(2 * \pi * f_0 * t + \phi)$$

It is understood from the foregoing that the beat signal I outputted from the optical detector element 92 contains the modulation index $\phi$ corresponding to the electromagnetic field intensity measured which is not influenced by any disturbance.

By phase detecting the beat signal I from the optical detector element 92 based on a reference signal outputted from the oscillator 84, the phase meter 94 determines the modulation index $\phi$ which is in turn directed to the display 96 in the form of a voltage signal given by:

$$V_0 = K * \phi$$

where K is constant.

Since the modulation index $\phi$ corresponds to the voltage between the electrodes 60a and 60b in the phase modulating section 58, the voltage $V_0$ from the phase meter 94 is proportional to the electromagnetic field intensity detected by the antennas 52a and 52b.

Thus, the display 96 displays the value of the electromagnetic field intensity which is calculated by the voltage $V_0$ from the phase meter 94 multiplied by an appropriate coefficient.

On measurement of the electromagnetic field intensity, the present invention utilizes the phase difference $\phi$ between the first and second polarized light components contained in the measuring light 200, rather than the intensity of this measuring light. In order to extract such a phase difference $\phi$, the present invention uses the first and second polarized light components 200a and 200b set such that they are orthogonal to each other and have the respective frequencies $f_1$ and $f_2$ slightly different from each other. Consequently, the frequencies $f_1$ and $f_2$ of the first and second polarized light components 200a and 200b will not substantially be varied even if the laser beam as from the laser 72 is changed in intensity or even if the optical fibers 66 and 68 and the waveguide 56 are subjected to any disturbance. If a beat signal is formed from the first and second polarized light components 200a and 200b, the modulation index $\phi$ can be accurately extracted from such a beat signal. As a result, the electromagnetic field intensity can be more accurately measured without affection of variations in the intensity of the source light beam and/or various disturbances from temperature, vibration, pressure, etc.

The present invention is particularly effective to measure the intensity of an electromagnetic field in the low-frequency region which could not be measured by the prior art, over a prolonged time period in a stable manner and with an increased precision.

As the first and second polarized light components 200a and 200b are being propagated through the optical fibers 66 and 68, the present invention provides such an arrangement that the directions of polarization in the optical input polarization-maintaining fiber 66 are exactly opposite to those of the optical output polarization-maintaining fiber 68. Furthermore, these optical polarization-maintaining fibers 66 and 68 are arranged to be close to each other.

Even if the entire length of the optical fibers is changed by any variation such as temperature or the like to create the phase shifts $\theta_1$ and $\theta_2$ in the first and second polarized light components 200a and 200b inputted to the optical detector element 92, these phase shifts will be equal substantially to each other, that is, $\theta_1 = \theta_2$.

Even when the first and second polarized light components 200a and 200b being propagated through the optical fibers 66 and 68 are subjected to phase shift due to any disturbance, these polarized light components will not be adversely affected by the disturbance. Therefore, the electromagnetic field intensity can be measured more accurately.

The electromagnetic field intensity measuring apparatus of the present invention can measure the electromagnetic field intensity in the measuring place 100 substantially without disturbing the environment of electromagnetic field not to be measured.

We claim:

1. An electromagnetic field intensity measuring apparatus, comprising:

means for generating a measuring light having first and second polarized light components which are orthogonal to each other and have frequencies differing slightly from each other by a value $f_0$;

sensor means for detecting an intensity of an electromagnetic field and producing an electrical signal having a strength proportional to the electromagnetic field intensity;

phase modulation means optically coupled to said measuring light generating means and electrically coupled to said sensor means for changing a phase of one of the first and second polarized light components in an amount proportional to the electrical signal strength from the sensor means;

beat signal generating means optically coupled to the phase modulation means for generating a beat signal using a combination of the first and second polarized light components received from the phase modulation means;

phase modulation calculation means connected to the beat signal generating means for receiving the beat signal and calculating a phase modulation index $\phi$ of the beat signal representative of a phase difference between the first and second polarized light components modulated by the phase modulation means; and electromagnetic field calculating means connected to the phase modulation calculation means for calculating the electromagnetic field intensity using the phase modulation index $\phi$;

input light transmission means comprising an optical input polarization maintaining fiber means for coupling the first and second light components of the measuring light from the measuring light generation means to the phase modulation means, the first polarized light components being coupled with an X axis polarization, and the second polarized light components being coupled with a Y axis polarization;

output light transmission means comprising an optical output polarization maintaining fiber means for coupling said first and second polarized components of the measuring light from the phase modulation means to the beat signal generating means, said first polarized components being coupled with a Y axis polarization, and the second polarized light components being coupled with an X axis polarization and said output polarization maintaining fiber means being disposed close and parallel to said optical polarization maintaining fiber means;

wherein said light generation means and said beat signal generating means are outside of an electromagnetic field intensity measuring place and the phase modulation means and said sensor means are inside the electromagnetic field intensity measuring place;

said phase modulation means comprising a waveguide for propagating said first polarized light components from said optical input polarization-maintaining fiber means in TE mode and for propagating said second polarized light components from said optical input polarization maintaining fiber means in TM mode; and a phase modulating section for applying the electrical signal from said sensor means to said waveguide to cause it to change a phase difference between the TM and TE mode polarized light components, which corresponds to the intensity of the electromagnetic field.

2. An electromagnetic field intensity measuring apparatus as defined in claim 1, wherein said measuring light generating means comprises:

a source of light for emitting a coherent light beam;

a first polarizing beam splitter for separating said coherent light beam into the first and second polarized light components which are orthogonal to each other;

an optical frequency shifting means for shifting the second polarized light component by a given frequency such that the frequency of the second polarized light component will be slightly different from that of the first polarized light component by the value $f_0$; and a second polarizing beam splitter for re-combining said first polarized light component with the second polarized light component outputted from said optical frequency shifting means to form the measuring light output from the measuring light generating means containing the first and second polarized light components which are orthogonal to each other and slightly different in frequency from each other.

3. An electromagnetic field intensity measuring apparatus as defined in claim 2 wherein said measuring light generating means comprises:

a first reflecting mirror for reflecting the second polarized light component separated by and outputted from said first polarizing beam splitter toward said optical frequency shifting means; and a second reflecting mirror for reflecting the first polarized light component separated by and outputted from said first polarizing beam splitter toward said second polarizing beam splitter.

4. An electromagnetic field intensity measuring apparatus as defined in claim 2 wherein said light source includes a semiconductor laser.

5. An electromagnetic field intensity measuring apparatus according to claim 1, wherein:

said sensor means includes an integrated antenna formed on a same substrate as said phase modulation means by means of photolithograph.

6. An electromagnetic field intensity measuring apparatus according to claim 1, wherein said electromagnetic field calculating means comprises:

means for calculating the electromagnetic field intensity based on the product of $\phi$ and a predetermined constant K.

7. An electromagnetic field intensity measuring apparatus according to claim 6, further comprising:

display means for displaying the calculated electromagnetic field intensity V.

8. An electromagnetic field intensity apparatus according to claim 7, wherein said beat signal generating means comprises:

means for square law detecting the first and second polarized light components.

9. An electromagnetic field intensity measuring apparatus according to claim 8, wherein the phase modulation calculating means comprises:

means for determining the phase modulation index $\phi$ by solving the equation:

$$I = I_0 * \cos(2*\pi*f_0*t + \phi);$$

for $\phi$.

10. An electromagnetic field intensity measuring apparatus according to claim 9, wherein the means for generating a measuring light comprises:

means for generating the first polarized light component according to the equation:

$$E_1 = E_{01} * \cos(2*\pi*f_1*t + \theta_1);\text{ and}$$

means for generating the second light component according to the equation:

$$E_2 + E_{02} * \cos(2*\pi*f_2*t + \theta_2);$$

said phase modulation means comprises:
means for changing the equation of the second polarized light component to be:

$$E_2 + E_{02} * \cos(2*\pi*f_2*t + \theta_2 + \phi);\text{ and}$$

the beat signal generating means comprises:
means for generating the beat signal according to an equation equivalent to:

$$I + I_0 * \cos[2*\pi*(f_1 - f_2)*t + (\theta_1 - \theta_2) + \phi].$$

11. An electromagnetic field measuring apparatus according to claim 1, wherein:

said phase modulation means is made of $LiNbO_3$.

12. An electromagnetic field measuring apparatus according to claim 1, further comprising:

an integrated optics device including the phase modulation means made of material from a group consisting of $LiNbO_3$ and $LiTaO_3$.

* * * * *

UNITED STATES PATENT AND TRADEMARK OFFICE
CERTIFICATE OF CORRECTION

PATENT NO. : 5,227,715
DATED : July 13, 1993
INVENTOR(S) : Ito et al It is certified that error appears in the above-identified patent and that said Letters Patent is hereby corrected as shown below:

On title page, item, [30] Foreign Application Priority Data, change "Jun. 11, 1990" to --Nov. 6, 1990--.

Signed and Sealed this

Sixteenth Day of May, 1995

Attest:

BRUCE LEHMAN

*Attesting Officer*      *Commissioner of Patents and Trademarks*